United States Patent [19]

Inoue et al.

[11] Patent Number: 4,631,421
[45] Date of Patent: Dec. 23, 1986

[54] CMOS SUBSTRATE BIAS GENERATOR

[75] Inventors: Shinji Inoue; Rama S. Akundi, both of Houston, Tex.

[73] Assignee: Texas Instruments, Dallas, Tex.

[21] Appl. No.: 640,720

[22] Filed: Aug. 14, 1984

[51] Int. Cl.⁴ .............................................. H03L 1/00
[52] U.S. Cl. ................................. 307/297; 307/296 R; 307/594; 307/597
[58] Field of Search .................... 307/296 R, 297, 304, 307/592, 594, 597, 603, 605

[56] References Cited

U.S. PATENT DOCUMENTS

| | | | |
|---|---|---|---|
| 4,233,672 | 11/1980 | Suzuki et al. | 307/296 R X |
| 4,388,537 | 6/1983 | Kanuma | 307/296 R X |
| 4,455,628 | 6/1984 | Ozaki et al. | 307/296 R X |
| 4,471,290 | 9/1984 | Yamaguchi | 307/297 X |
| 4,473,758 | 9/1984 | Huntington | 307/296 R |
| 4,547,682 | 10/1985 | Bialas, Jr. et al. | 307/297 |
| 4,553,047 | 11/1985 | Dillinger et al. | 307/297 |

OTHER PUBLICATIONS

Harroun, "Substrate Bias Voltage Control", *IBM T.D.B.*, vol. 22, No. 7, Dec. 1979, pp. 2691-2692.

*Primary Examiner*—Stanley D. Miller
*Assistant Examiner*—D. R. Hudspeth
*Attorney, Agent, or Firm*—John G. Graham; Rodney M. Anderson

[57] ABSTRACT

A generator for producing a negative bias voltage on a semiconductor device employs an on-chip oscillator driving two charge pump circuits. The oscillator produces a frequency inversely related to the negative bias, using a feedback circuit, thus reducing standby current. Each of the charge pumps include a CMOS inverter for controlling the transistor that functions as a diode connection to the ground terminal, producing an efficient charge transfer and speeding up generation of the bias voltage. Both charge pumps are used during power-up so the bias is rapidly increased to the operating level, then one is turned off to reduce current drain. A shunt circuit prevents CMOS latch-up during power-UP by coupling the substrate node to ground, preventing forward bias of N+ source/drain regions with respect to P substrate.

14 Claims, 2 Drawing Figures

CMOS SUBSTRATE BIAS GENERATOR

BACKGROUND OF THE INVENTION

This invention relates to semiconductor devices, and more particularly to substrate bias generator circuits for dynamic read/write memory devices or the like.

Substrate bias generator circuits for MOS LSI devices have been costructed as shown in U.S. Pat. No. 4,115,710, issued to Perry W. Lou, U.S. Pat. No. 4,494,223, issued Jan. 15, 1985 to G. R. M. Rao and C. N. Reddy, or Ser. No. 512,078, filed July 8, 1983 by Hashimoto & Reddy, assigned to Texas Instruments. The very high density dynamic RAMs now being designed have more stringent requirements, however. The power dissipation during both operating and standby modes is more critical, and since CMOS structures are used latch-up becomes a problem at power-on.

It is the principal object of this invention to provide an improved substrate bias generator circuit for a semiconductor device such as a dynamic RAM. Another object is to provide a charge pump circuit that is more efficient and operates faster. Another objet is to provide a substrate bias generator that reduces operating and standby power dissipation.

SUMMARY OF THE INVENTION

In accordance with one embodiment of the invention, a generator for producing a negative bias voltage on a semiconductor device employs an on-chip oscillator driving two charge pump circuits. The oscillator produces a frequency inversely related to the negative bias, using a feedback circuit, thus reducing standby current. Each of the charge pumps include a CMOS inverter for controlling the transistor that functions as a diode connection to the ground terminal, producing an efficient charge transfer and speeding up generation of the bias voltage. Both charge pumps are used during power-up so the bias is rapidly increased to the operating level, then one is turned off to reduce current drain. A shunt circuit prevents CMOS latch-up during power-up by coupling the substrate node to ground, preventing forward bias of N+ source/drain regions with respect to P substrate.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
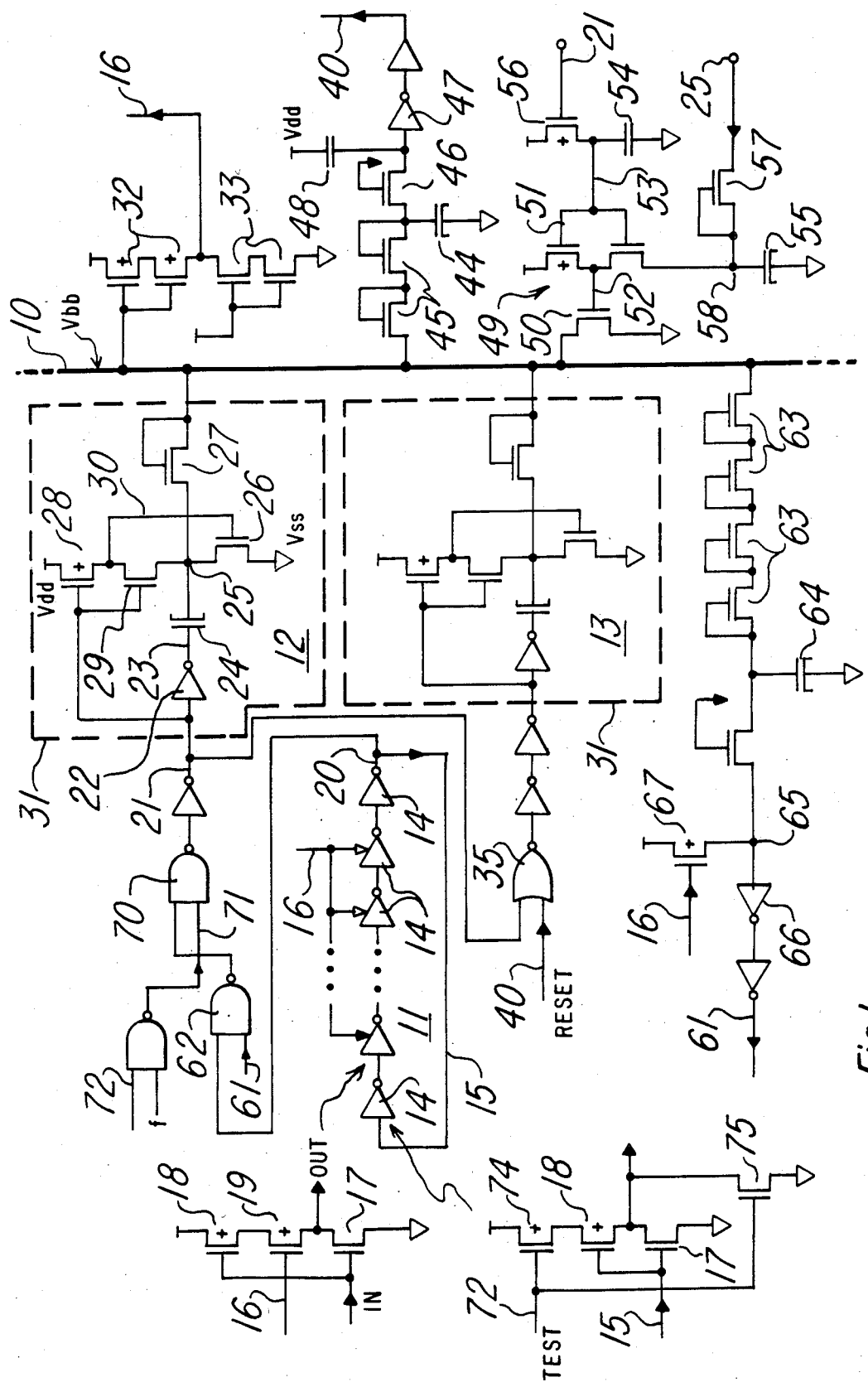
FIG. 1 is an electrical schematic diagram of a substrate bias generator circuit constructed according to the invention.

With reference to FIG. 1, a substrate bias generator constructed according to various features of the invention is illustrated. This generator arrangement functions to pump a substrate node 10 to a negative voltage Vbb, about $-3v$ or $-4v$, more or less, with respect to a Vss or ground potential applied to the chip. An oscillator is employed which has a frequency responsive to Vbb feedback, and this oscillator drives two charge pump circuits 12 and 13. The second charge pump 13 is operative under control of reset signal generated when the supply voltage Vdd is first applied. A shunt circuit prevents CMOS latch-up during power-on.

Figure 2:
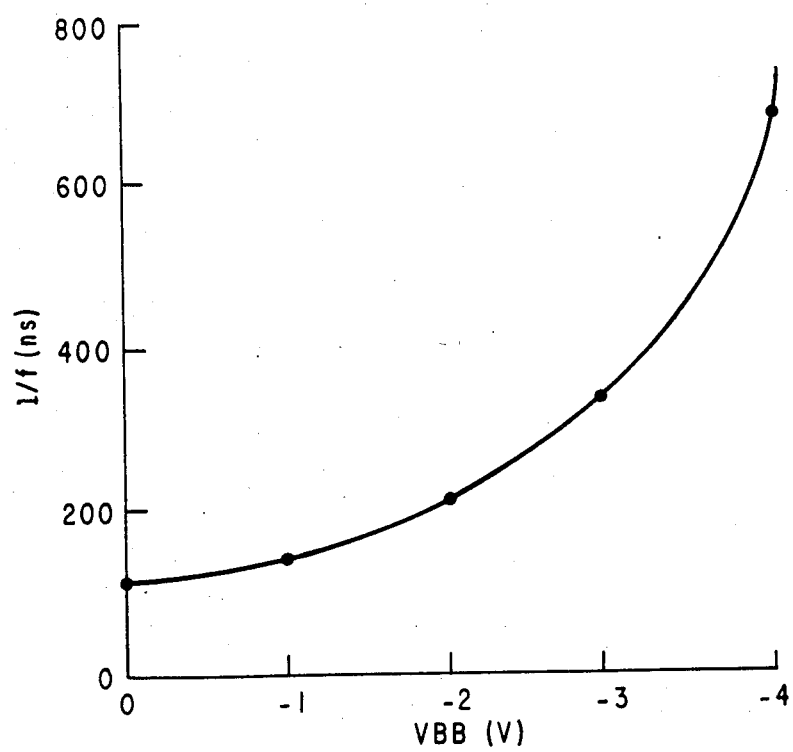
FIG. 2 is a graph of frequency vs. feedback voltage for an oscillator in the circuit of FIG. 1.

The oscillator 11 consists of an odd number (in this example, nine) of cascaded inverter stages 14 with a feedback path 15 from the last stage to the first. The frequency of oscillation is dependent upon the delay in propagating a Vdd-to-Vss or Vss-to-Vdd transition through the nine stages. A number of the stages (seven in the example) receive a Vbb feedback signal from line 16, and this signal changes the internal RC time constants of these stages, so that the frequency of the oscillator decreases as Vbb becomes more negative, i.e., negative bias increases. Each of the inverter stages receiving feedback from line 16 consist of N and P channel transistors 17 and 18, with another P channel transistor 19 in series, so as Vbb goes from zero (at power-on) to a more negative value the voltage on line 16 goes from a low value to a more positive voltage, and thus the transistor 19 goes from very low resistance to higher resistance, increasing the delay in charging the output node of the inverter stage when its input switches. The frequency of the oscillator 11 as a function of Vbb is shown in FIG. 2.

An output node 20 of the oscillator 11 drives the input 21 of the clamping diode cicuit 12 (through two NAND gates, as will be explained). The circuit 12 consists of a buffer 22 having its output node 23 coupled by a capacitor 24 to a pump node 25. The pump node 25 is connected to the ground terminal Vss by a transistor 26 acting as a diode, and to the Vbb node 10 by a transistor 27 acting as a diode. When the input 21 from the oscillator output 20 makes a high to low transition, propagating through the inverter 22 the node 23 makes a positive transition with respect to Vss, and this transition is coupled through the capacitor 24 to the node 25; but any tendancy for the node 25 to be positive with respect to Vss results in conduction of transistor/diode 26. However, when the input 21 from the oscillator makes a positive transition (Vss-to-Vdd), the inverter 22 produces a negative-going transition on the node 23, and thus on the node 25 through the capacitor 24; in this case the node 25 will go negative with respect to Vss because transistor 26 will not conduct in this direction. The transistor 27 will conduct, pulling node 10 more negative, if node 25 goes negative with respect to the existing Vbb. The charge pump 13 is of the same construction as this charge pump 12.

According to one feature of the invention, the gate of the transistor 26 in the clamping circuit 21 is driven by a CMOS inverter having a P channel transistor 28 and an N channel transistor 29. The gates of these transistors 28 and 29 are driven by the input 21 from the oscillator. Between transitions, while the input 21 is at Vss, the transistor 28 is on and 29 is off, charging the gate 30, so transistor 26 is on, but no current flows through it due to transistor 27 conducting only one direction. On the positive-going transition of the input 21 from the oscillator, transistor 29 is turned on while transistor 28 is turned off, so the gate 30 discharges, until the gate of transistor 30 is shunted to the node 25. On the negative-going transition, the reverse occurs, turning on transistor 28, turning off transistor 29, and thus turning on transistor 26, so the positive pulse on node 25 is coupled to Vss The use of the CMOS inverter instead of conventional circuits allows operation which does not depend upon the diode threshold voltage of the transistor 26 itself. Consequently, more efficient charge transfer is provided, and the Vbb set up time can be faster. In addition, a P+ diffused guard ring 31 surrounds the elements of the charge pumping circuit 21 on the face of the chip, and this P+ ring is connected to Vbb in order to avoid injection of minority carriers into the memory cell array or peripheral circuitry; electrons are prevented from diffusing out of the charge pump area by the P+ ring connected to Vbb since the electrons are attracted to the guard ring.

The Vbb detector circuit to produce the feedback signal on line 16 consists of series-connected P channel transistors 32 and N channel transistors 33. The gates of the transistors 32 are connected to the Vbb node 10, and the gates of the transistors 33 to Vdd. These transistors are very small in size so their resistance is high and current drain is small. The N-channel transistors 33 function as a fixed resistor. The resistance of the P-channel transistors 32 decreases as the Vbb becomes more negative. The voltage divider output, which is the feedback voltage on line 16, becomes more positive with a more negative Vbb, so the transistors 19 become more resistive.

The second charge pump circuit 13, which is just like the circuit 12, receives at its input the oscillator 11 output via the node 21 and a NOR gate 35, so the node 10 will be pumped by the two circuits 12 and 13 at a rate dependent upon the frequency of the oscillator 11. The oscillator input to circuit 13 is controlled by a reset signal on line 40, however, so that the double pumping operation occurs only for a short period after power is first applied. When the reset voltage on line 40 is at Vdd, the gate 35 prevents the oscillator output from reaching the input of pump 13. The reset voltage is generated by a circuit having a capacitor 44 coupled to the Vbb node 10 through N-channel transistors 45. An N-channel transistor 46 with grounded gate connects the capacitor voltage to the input of inverter 47. A buffer connects the inverter output to the line 40. The input of this inverter 47 is coupled to Vdd by a capacitor 48, so when Vdd is initially connected to the circuit the inverter output is at Vss and line 40 is at Vss. In operation, the voltage across the capacitor 44 is zero when Vdd is first applied, and charges negatively as Vbb goes from zero to a negative voltage, thus pulling the input of inverter 47 low until line 40 goes to Vdd, shutting off the pump circuit 13. This would occur in perhaps 50 μs after power-on.

The shunt circuit 49 functions to connect the Vbb node 10 to Vss through a transistor 50 for the purpose of preventing latch-up during power-on. A CMOS inverter 51 has an output 52 connected to the gate of the transistor 50 and an input 53 connected to a capacitor 54. Initially, when the supply Vdd is first connected to the circuit, the capacitor 54 is at zero charge, so the output 52 is high and the shunt transistor 50 is turned on fully. A capacitor 55 connected to the lower side of the inverter 51 is also initially at zero charge. The capacitor 54 is charged from Vdd through a transistor 56 by output pulses from the oscillator 11, taken at the input 21 of the charge pump. When the capacitor 54 has charged to the threshold voltage, the inverter output shuts off the shunt transistor 50. This occurs about one μs after Vdd is applied. The timing of the shunt function is determined by the value of this capacitor 54. The capacitor 55 is pumped negative by a diode 57 connected to the node 25 of the charge pump circuit 12; the node 58 across the capacitor 55 will be at less than Vbb so that the proper voltage relationship exists for the inverter 51 and gate 52 when transistor 50 has a negative drain voltage −Vbb.

In order to prevent the substrate from being pumped to a value lower than −5v, a limiter circuit 60 produces an output 61 to a NAND gate 62 which functions to block the oscillator output from reaching the pump circuits 12 or 13. The limiter circuit 60 is similar to the reset detector, and consists of four N-channel transitors 63 connecting the node 10 to a capacitor 64, which tends to charge this capacitor to the negative Vbb voltage if Vbb exceeds the thresholds of the four transistors 63. A node 65 at the input of an inverter 66 is coupled to Vdd through a P-channel transistor 67 having the feedback voltage 16 on its gate, and is coupled to the capacitor 64 by N-channel transistor 68 having a grounded gate. The node 65 goes high at power-up while the feedback voltage is zero, but is discharged if Vbb exceeds the negative limit, thus switching the voltage on line 61 to the NAND gate 62 and cutting off the oscillator output path to input 21 of the charge pump.

A second NAND gate 70 receives a test input 71 which is a frequency f coupled to the chip from external. A test control input 72 gates in this frequency f and also shuts off the first of the oscillator stages 14 by transistors 74 and 75. When the test control input is at Vss, the P-channel transistor 74 in this first stage 14 is conductive and N-channel transistor 75 is turned off, so the inverter stage operates normally. But when test control 72 goes to Vdd, the first stage 14 shuts off and the oscillator 11 no longer functions. The known frequency f is substituted, and so the performance of the substrate pump can be measured while the chip is in slice form at a multiprobe test station.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this desription. It is therefore contemplated that the appended claims will cover any such modifications or embodiments as fall within the true scope of the invention.

What is claimed:

1. A substrate bias generator circuit comprising:
a bias node,
means for generating a feedback signal related to the voltage on said bias node,
an oscillator responsive to said feedback signal so that its frequency is inversely related to the voltage on said bias node, and
a charge pump circuit comprising a capacitor, a transistor having a source-to-drain path in series with the capacitor and having a gate, buffer means coupling the output of the oscillator to one side of said capacitor, a CMOS inverter, responsive to the output of the oscillator and connected to said gate, for coupling said gate to the other side of said capacitor or to a voltage supply dependent upon the output of the oscillator, and a diode having an anode connected to said bias node and having a cathode connected to said other side of said capacitor.

2. A circuit according to claim 1 including a second charge pump circuit comprising a second capacitor, a second transistor having a source-to-drain path in series with said second capacitor and having a gate, a second buffer means coupling the output of the oscillator to one side of said second capacitor, a second CMOS inverter, responsive to the output of the oscillator and connected to said gate, for coupling said gate to the other side of said second capacitor or to said voltage supply dependent upon the output of the oscillator, and a second diode having an anode connected to said bias node and having a cathode connected to said other side of said second capcitor.

3. A circuit according to claim 1 wherein said oscillator includes voltage-responsive stages and wherein a representation of the voltage on said bias node is coupled to said voltage-responsive stages.

4. A substrate bias generator circuit comprising:
a bias node,
means for generating a feedback signal related to the voltage on said bias node,
an oscillator responsive to said feedback signal so that its frequency is inversely related to the voltage on said bias node,
a charge pump circuit having an input coupled to receive the output of said oscillator, and having an output coupled to said bias node, and
a shunt circuit connected to a voltage supply, for coupling said bias node to a ground terminal, the shunt circuit being activated at power-up of said voltage supply and being deactivated in response to said oscillator output.

5. A substrate bias pumping circuit for a dynamic MOS read/write memory or the like constructed on a semiconductor substrate, comprising:
(a) an oscillator having an output, and operating at a first frequency,
(b) a first pump circuit having a first output to the substrate, the pump circuit receiving said output from the oscillator and operating at said first frequency,
(c) a second pump circuit having a second output to the substrate, the second pump circuit receiving said output from the oscillator and operating at said first frequency,
(d) control means for disabling said second pump circuit when the voltage of said substrate exceeds a first selected level.

6. A circuit according to claim 5 including means for detecting the substrate bias and disabling said first pump circuit when such bias reaches a second selected level, said second selected level having an absolute value greater than said first selected level.

7. A circuit according to claim 6 including means for shunting said substrate to a reference potential of a voltage supply when the voltage supply is first connected to the memory, and for disabling said means for shunting after said oscillator has operated for a selected time.

8. A substrate bias generator for a semiconductor device comprising:
an oscillator having an output coupled to a first pump circuit,
means, coupled to said oscillator, and responsive to the substrate bias to control the frequency of said oscillator,
a second pump circuit, coupled to the output of said oscillator, and means, coupled to said second pump circuit, to activate said second pump circuit only for a selected time after a voltage supply is applied to said device.

9. A device according to claim 8 wherein said oscillator comprises a plurality of driver stages, and wherein said means responsive to the substrate bias comprises at least one of said driver stages coupled to the substrate and having its delay time responsive to the substrate bias.

10. A device according to claim 9, wherein each of said driver stages coupled to the substrate and having its delay time responsive to the substrate comprises:
an inverter comprising a first transistor and a second transistor, each having a source-to-drain path and a gate, said source-to-drain paths connected in series between said voltage supply and a ground terminal, said first and second transistors having opposite channel conductivity-types, said inverter having an output located between such source-to-drain paths, and said gates of said first and second transistors being connected together and coupled to the output of another of said driver stages, and
a third transistor, having a source-to-drain path and having a gate, said source-to-drain path of said third transistor connected in series with the source-to-drain paths of said first and second transistors,
and further comprising means, connected to the substrate and to said gate of said third transistor, for coupling said gate of said third transistor to the substrate so that the conductivity of said source-to-drain path of said third transistor is responsive to the substrate bias.

11. A substrate bias generator circuit comprising:
an oscillator having an output,
a first charge pump circuit comprising a first capacitor, a first buffer means connected between said output of said oscillator and one side of said first caacitor, a first diode having its anode connected to the substrate and its cathode connected to the other side of said capacitor, a first transistor having a source-to-drain path connected between the other side of said first capacitor and a ground terminal and having a gate, and a first means, responsive to said output of said oscillator, for coupling said gate of said first transistor alternatively to said other side of said first capacitor and to a voltage supply, and
means, responsive to the substrate voltage and connected to said oscillator, for generating a feedback signal related to the substrate voltage,
wherein said oscillator is responsive to said feedback signal so that its frequency is inversely related to the substrate voltage.

12. A circuit according to claim 11 further comprising a second charge pump circuit comprising a second capacitor, a second buffer means connected between said output of said oscillator and one side of said capacitor, a second diode having its anode connected to the substrate and its cathode connected to the other side of said second capacitor, a second transistor having a source-to-drain path connected between the other side of said second capacitor and said ground terminal and having a gate, and a second means, responsive to said output of said oscillator, for coupling said gate of said second transistor alternatively to said other side of said second capacitor and to said voltage supply.

13. A circuit according to claim 12 further comprising means, responsive to the substrate voltage and connected to said second charge pump circuit, for disabling said second charge pump circuit when the substrate voltage reaches a first predetermined level.

14. A circuit according to claim 13 further comprising means, responsive to the substrate voltage and connected to said first charge pump circuit, for disabling said first charge pump circuit when the substrate voltage reaches a second predetermined level, said second predetermined level having a magnitude greater than said first predetermined level.

* * * * *